(12) United States Patent
Rath et al.

(10) Patent No.: US 8,813,019 B1
(45) Date of Patent: Aug. 19, 2014

(54) OPTIMIZED DESIGN VERIFICATION OF AN ELECTRONIC CIRCUIT

(71) Applicant: NVIDIA Corporation, Santa Clara, CA (US)

(72) Inventors: Avinash Rath, Bangalore (IN); Sanjith Sleeba, Bangalore (IN); Ashish Kumar, Banagalore (IN)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/873,263

(22) Filed: Apr. 30, 2013

(51) Int. Cl.
*G06F 17/50* (2006.01)
*G01R 31/28* (2006.01)
*G01R 27/28* (2006.01)
*G06F 11/07* (2006.01)

(52) U.S. Cl.
CPC ........ *G06F 17/5022* (2013.01); *G06F 17/5081* (2013.01); *G06F 2217/12* (2013.01); *G06F 2217/14* (2013.01); *G06F 11/07* (2013.01); *G01R 31/28* (2013.01); *G01R 27/28* (2013.01)
USPC ........... 716/136; 716/106; 716/111; 716/112; 703/16; 714/30; 714/732; 714/733; 714/734; 714/741; 702/117

(58) Field of Classification Search
CPC ............ G06F 17/5022; G06F 17/5081; G06F 2217/12; G06F 2217/14; G06F 11/07; G01R 31/28; G01R 27/28
USPC ..................... 716/136, 106, 111, 132; 703/16; 714/30, 732, 733, 734, 741; 702/117
See application file for complete search history.

(56) References Cited

U.S. PATENT DOCUMENTS

| 5,414,716 | A | * | 5/1995 | Bershteyn | 714/738 |
| 5,805,795 | A | * | 9/1998 | Whitten | 714/38.1 |
| 7,065,726 | B1 | | 6/2006 | Singhal et al. | |
| 7,139,676 | B2 | * | 11/2006 | Barford | 702/183 |
| 7,165,074 | B2 | * | 1/2007 | Avvari et al. | 717/124 |
| 7,269,809 | B2 | | 9/2007 | Shastri et al. | |
| 7,376,919 | B1 | | 5/2008 | McElvain et al. | |
| 7,516,423 | B2 | | 4/2009 | De Smedt et al. | |
| 7,552,361 | B2 | * | 6/2009 | Galler et al. | 714/38.1 |
| 8,015,520 | B2 | | 9/2011 | McElvain et al. | |
| 8,612,938 | B2 | * | 12/2013 | Prasad et al. | 717/128 |
| 2003/0139906 | A1 | * | 7/2003 | Barford | 702/183 |

(Continued)

FOREIGN PATENT DOCUMENTS

| EP | 1221663 | A2 | | 7/2002 | |
| JP | 2004355130 | A | * | 12/2004 | ............. G06F 17/50 |
| WO | 9837475 | A3 | | 2/1999 | |
| WO | 2004046975 | A1 | | 6/2004 | |

*Primary Examiner* — Phallaka Kik
(74) *Attorney, Agent, or Firm* — Zilka-Kotab, PC (57) ABSTRACT

A method includes reading, through a processor of a computing device communicatively coupled to a memory, a design of an electronic circuit as part of verification thereof. The method also includes extracting, through the processor, a set of optimized instructions of a test algorithm involved in the verification such that the set of optimized instructions covers a maximum portion of logic functionalities associated with the design of the electronic circuit. Further, the method includes executing, through the processor, the test algorithm solely relevant to the optimized set of instructions to reduce a verification time of the design of the electronic circuit.

20 Claims, 6 Drawing Sheets

(56) References Cited

U.S. PATENT DOCUMENTS

| | | | |
|---|---|---|---|
| 2003/0212924 A1* | 11/2003 | Avvari et al. | 714/38 |
| 2005/0262409 A1* | 11/2005 | Wang et al. | 714/738 |
| 2008/0148247 A1* | 6/2008 | Galler et al. | 717/154 |
| 2008/0234967 A1* | 9/2008 | Vandewiele et al. | 702/119 |
| 2009/0125771 A1* | 5/2009 | Duggal et al. | 714/731 |
| 2010/0175052 A1* | 7/2010 | Prasad et al. | 717/128 |
| 2013/0111267 A1* | 5/2013 | Beryoza et al. | 714/32 |
| 2013/0311976 A1* | 11/2013 | Bhat et al. | 717/130 |

\* cited by examiner

REDUCED MBIST TEST

A) GENERATION OF MEMORY READ/WRITE ADDRESS
    I.    ADDRESS TYPE – REGULAR, OFFSET.
    II.   ADDRESS ORDER – INCREMENT, DECREMENT B) GENERATION OF MEMORY READ/WRITE CONTROLS
    A.   WRITE, READ C) GENERATION OF WRITE DATA AND EXPECTED DATA.
    A.   BLANKET 0/1 (BL0, BL1)
    B.   ALTERNATING 10/01 (ALT10, ALT 01)
    C.   CHECKERBOARD (CH0, CH1)
    D.   ROW STRIPE (ROW0, ROW1)

D) COMPARISON OF READ DATA WITH EXPECTED DATA.
E) HANDSHAKE WITH CENTRAL MBIST CONTROLLER.

FIGURE 4

TEST ALGORITHM

| ME | ADDRESS TYPE | | ADDRESS ORDER | | RW CONTROL | | DATA | | | | | | |
|---|---|---|---|---|---|---|---|---|---|---|---|---|---|
| | REGULAR | OFFSET | INCR | DECR | WRITE | READ | BL 0 | BL 10 | ALT 10 | ALT 01 | CH 0 | CH 1 | ROW 0 | ROW 1 |
| TEST1 0 | ✓ | | ✓ | | ✓ | | | | | | | | | |
| 1 | | | | | | | | | ✓ | | | | | |
| 2 | | | | | ✓ | | | | ✓ | | | | | |
| 3 | | | | | ✓ | | | | | ✓ | | | | |
| 4 | ✓ | | ✓ | | | ✓ | | | | ✓ | | | | |
| 5 | | | | | ✓ | | | | ✓ | | | | | |
| 6 | | | | | ✓ | | | | ✓ | ✓ | | | | |
| 7 | | | | | ✓ | | | | | ✓ | | | | |
| 8 | ✓ | | ✓ | | | ✓ | | | | ✓ | | | | |
| 9 | | | | | ✓ | | | | ✓ | | | | | |
| A | | | | | ✓ | | | | ✓ | | | | | |
| B | | | | | ✓ | | | | | ✓ | | | | |
| C | | | | | | ✓ | | | | ✓ | | | | |
| D | | | | | | ✓ | | | | ✓ | | | | |
| E | ✓ | | | ✓ | | | | | ✓ | | | | | |
| F | ✓ | | | | | ✓ | | | | ✓ | | | | |
| 10 | | | | | | | | | | | | | | |
| 11 | | | | | | | | | | | | | | |
| 12 | | | | | | | | | | | | | | |
| 13 | | | | | | | | | | | | | | |
| 14 | ✓ | | | ✓ | | | | | | | | | | |
| 15 | ✓ | | | ✓ | | | | | | | | | | |

TRIMMED TEST ALGORITHM

| ME | ADDRESS TYPE | | ADDRESS ORDER | | RW CONTROL | | DATA | | | | | | |
|---|---|---|---|---|---|---|---|---|---|---|---|---|---|
| | REG ADDR | INC BIT SAME | INCR | DECR | WRITE | READ | BL 0 | BL 10 | ALT 10 | ALT 01 | CH 0 | CH 1 | ROW 0 | ROW 1 |
| TEST1 E | ✓ | | | ✓ | ✓ | | | | | ✓ | | | | |
| F | ✓ | | | | | ✓ | | | | ✓ | | | | |

FIGURE 5

OPTIMIZED DESIGN VERIFICATION OF AN ELECTRONIC CIRCUIT

FIELD OF TECHNOLOGY

This disclosure relates generally to electronic circuit verification and, more particularly, to a method, a device and/or a system of an optimized design verification of an electronic circuit.

BACKGROUND

An electronic circuit (e.g., a Very-Large-Scale-Integration (VLSI) circuit) may include several elements and interconnectors thereof. The elements (e.g., memories) may be prone to manufacturing defects due to dense packing therein and/or complex design thereof. A Built-In Self-Test (BIST) may be implemented during the verification of a design of the electronic circuit to test for the aforementioned manufacturing defects. The BIST may involve executing several algorithms on the elements to detect different types of structural faults. The aforementioned simulation may have a large runtime associated therewith as an entire address space of each element is covered for all the algorithms.

SUMMARY

Disclosed are a method, a device and/or a system of an optimized design verification of an electronic circuit.

In one aspect, a method includes reading, through a processor of a computing device communicatively coupled to a memory, a design of an electronic circuit as part of verification thereof. The method also includes extracting, through the processor, a set of optimized instructions of a test algorithm involved in the verification such that the set of optimized instructions covers a maximum portion of logic functionalities associated with the design of the electronic circuit. Further, the method includes executing, through the processor, the test algorithm solely relevant to the optimized set of instructions to reduce a verification time of the design of the electronic circuit.

In another aspect, a computing device includes a memory and a processor communicatively coupled to a memory. The processor is configured to execute instructions to read a design of an electronic circuit as part of verification thereof, and extract a set of optimized instructions of a test algorithm involved in the verification such that the set of optimized instructions covers a maximum portion of logic functionalities associated with the design of the electronic circuit. The processor is also configured to execute instructions to execute the test algorithm solely relevant to the optimized set of instructions to reduce a verification time of the design of the electronic circuit.

In yet another aspect, a non-transitory medium, readable through a computing device and including instructions embodied therein that are executable through the computing device, is disclosed. The non-transitory medium includes instructions to read, through a processor of the computing device communicatively coupled to a memory, a design of an electronic circuit as part of verification thereof. The non-transitory medium also includes instructions to extract, through the processor, a set of optimized instructions of a test algorithm involved in the verification such that the set of optimized instructions covers a maximum portion of logic functionalities associated with the design of the electronic circuit. Further, the non-transitory medium includes instructions to execute, through the processor, the test algorithm solely relevant to the optimized set of instructions to reduce a verification time of the design of the electronic circuit.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to provide a method, a system and/or a device of an optimized design verification of an electronic circuit. Although the present embodiments have been described with reference to specific example embodiments, it will be evident that various modifications and changes may be made to these embodiments without departing from the broader spirit and scope of the various embodiments.

Figure 1:
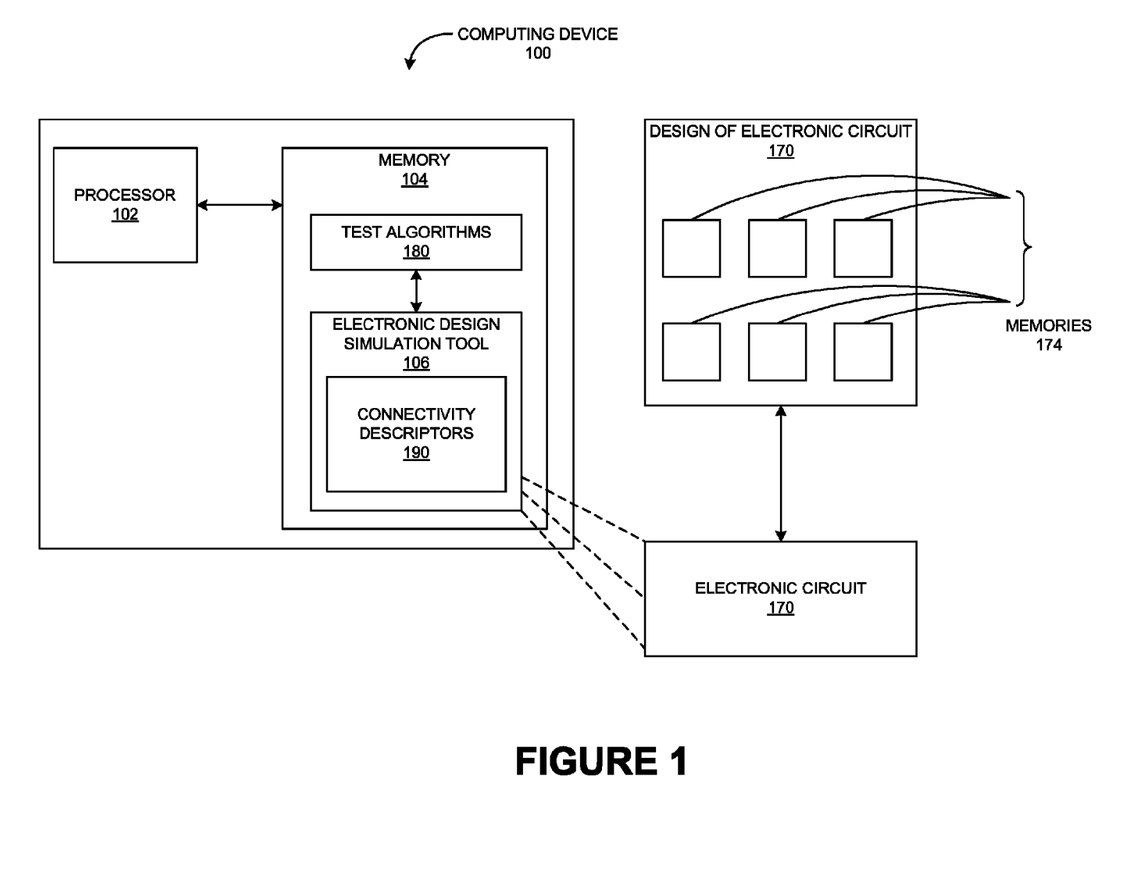
FIG. 1 is a schematic view of a computing device, according to one or more embodiments.

FIG. 1 shows a computing device 100, according to one or more embodiments. In one or more embodiments, computing device 100 may include a processor 102 (e.g., a Central Processing Unit (CPU), a Graphics Processing Unit (GPU); one or more processors) communicatively coupled to a memory 104 (e.g., a volatile memory and/or a non-volatile memory; one or more memories). Computing device 100, for example, may be a personal computer, a laptop computer, a notebook computer, a netbook, a tablet or even a computing node in a cluster computing system. Other forms of computing device 100 are within the scope of the exemplary embodiments. In one or more embodiments, computing device 100 may execute an electronic design simulation tool 106 on processor 102; FIG. 1 shows instructions associated with electronic design simulation tool 106 being stored in memory 104. Processor 102 may be configured to execute the test algorithms (to be discussed below) as part of electronic design simulation tool 106. Alternately, test algorithms may be executed external to the purview of electronic design simulation tool 106.

The memories (e.g., Static Random-Access Memory (SRAM)) incorporated in Application-Specific Integrated Circuit (ASIC) or System-on-a-Chip (SoC) designs may be prone to manufacturing defects due to dense packing and/or complex design thereof. Thus, it may be difficult to test the aforementioned embedded memories from external pins of a chip associated therewith "at speed." The Memory Built-in Self-Test (MBIST) may involve a specialized Design-For-Test (DFT) circuit utilized to test memories during design for manufacturing defects in structure(s) thereof. As the MBIST logic is placed proximate the memories in the chip, the MBIST may provide for reasonable controllability and observability of the memories, along with support for "at speed" testing.

MBIST may involve executing several test algorithms on the memories to detect different types of structural faults. The simulation (e.g., through electronic design simulation tool 106 at the Register-Transfer Level (RTL)) of the aforementioned algorithms may consume a lot of runtime due to the requirement of covering the entire address space of each memory on the chip (e.g., electronic circuit 170; memories 174 are shown as part of the design of electronic circuit 170) for all the algorithms. In FIG. 1, the test algorithms (e.g., test algorithms 180) are shown as being associated with electronic design simulation tool 106. The verification may start only at the connectivity descriptor (e.g., netlist) stage as the MBIST is integrated into the design only in the connectivity descriptors. Here, a connectivity descriptor may serve to describe interconnections (or, serve as nodal descriptions of) between the fundamental elements of electronic circuit 170; Again, FIG. 1 shows connectivity descriptors 190 being part of electronic design simulation tool 106 and utilized by test algorithms 180.

As the intent of circuit simulation is to detect bugs in the MBIST design and integration thereof in connectivity descriptors 190 and not memory faults, simulating the portions common to test algorithms 180 may be avoided without coverage loss to speed up the verification process.

To reduce MBIST simulation time, changing of clock frequency of a debug interface (e.g., Joint Test Action Group (JTAG) interface) associated with the chip and turning ON of selected clock domains may be attempted. The changing of the debug interface clock frequency may result in incorrect prediction of data shifted out of status registers; this may require tuning through a cumbersome hit and trial method. Further, the turning ON of selected clock domains may involve specific Phase-Locked Loop (PLL) programming that varies from project to project. While the aforementioned techniques reduce simulation time, multiple executions may be required to achieve full coverage.

Another approach to reduce simulation time may involve testing the MBIST with a basic algorithm (say, a short test) and then move to other tests in later revisions of connectivity descriptors 190. Here, the basic algorithm may have a limited coverage as only basic read-write operations involving one type of data background and addressing scheme is performed. Thus, although initial runtime is reduced, there may be other bugs that are detected later when the remaining algorithms are run. Late identification of bugs may require difficult connectivity descriptor modifications and verification thereof may also be challenging.

Figure 2:
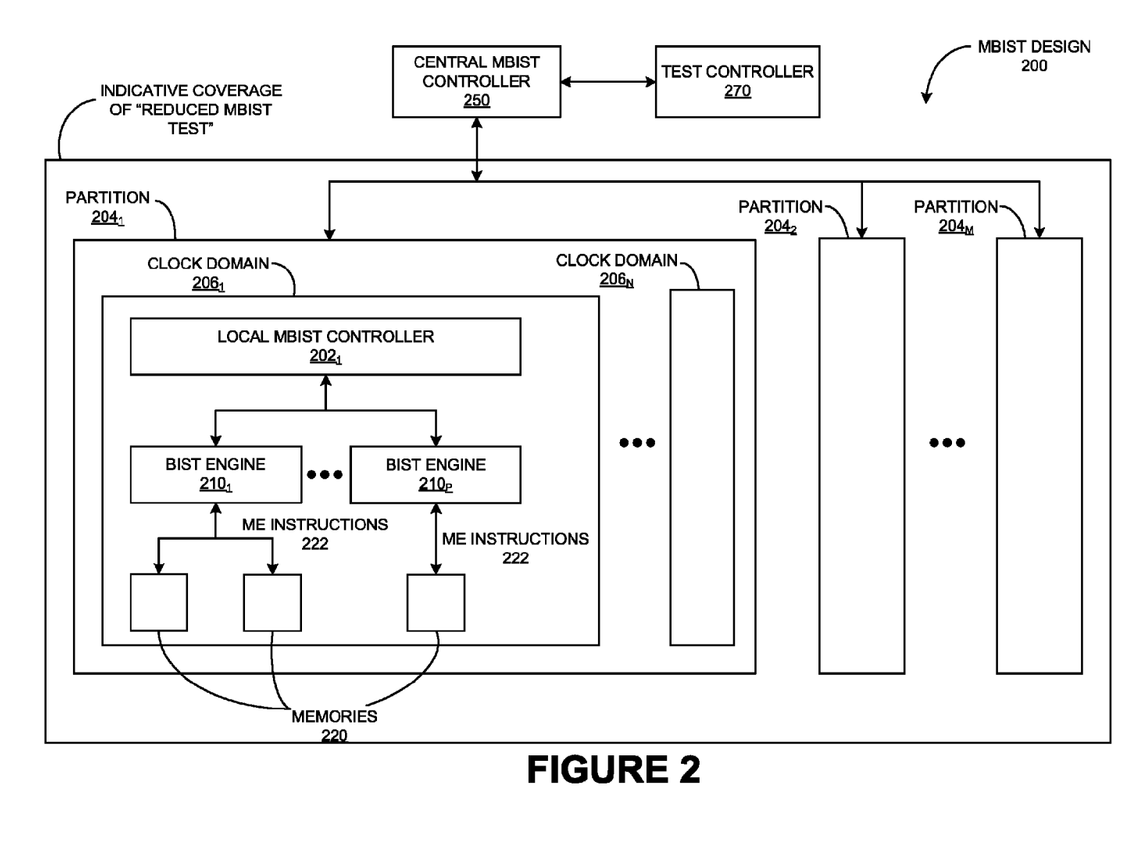
FIG. 2 is a schematic view of a Memory Built-In Self-Test (MBIST) design of an electronic circuit, according to one or more embodiments.

In one or more embodiments, issues discussed above may be tackled through adopting a verification scheme that targets the MBIST design instead of the structural faults of the memories. FIG. 2 shows an MBIST design 200, according to one or more embodiments. In one or more embodiments, MBIST design 200 may employ a local MBIST controller $202_{1-N}$ in each clock domain $206_{1-N}$ of electronic circuit 170; local MBIST controller $202_{1-N}$ may be unique to a chiplet, and may be configured to generate March Element (ME) instructions 222. ME instructions 222 may be related to a set of operations to be performed on memories (e.g., memory cells); here, a set of operations may be performed on a memory cell, following which the next memory cell is targeted. In one or more embodiments, each partition $204_{1-M}$ of MBIST design 200 may include multiple clock domains $206_{1-N}$. In one or more embodiments, partitions $204_{1-M}$ may be abstractions based on functionalities of electronic circuit 170. In one or more embodiments, there may be memories (RAMs) inside each partition $204_{1-M}$; memories may be grouped based on types and sizes.

In one or more embodiments, highly interactive functional logic may be grouped into partitions $204_{1-M}$. These partitions $204_{1-M}$ may include RAMs, functional logic and/or scan logic. In one or more embodiments, memories under a single clock domain $206_{1-N}$ may be grouped into a single local MBIST controller $202_{1-N}$. In one or more embodiments, each local MBIST controller $202_{1-N}$ may control one or more BIST engine(s) $210_{1-P}$ depending on the types of memories. In one or more embodiments, local MBIST controller $202_{1-N}$ may be configured to communicate with the one or more BIST engines $210_{1-P}$ through a synchronous interface.

In one or more embodiments, the one or more BIST engines $210_{1-P}$ may be configured to perform read/write tasks from/to the memories (e.g., memories 220 analogous to memories 174). In one or more embodiments, each local MBIST controller $202_{1-N}$ may generate ME instructions 222 to be decoded by the one or more BIST engines $210_{1-P}$; alternately, a central MBIST controller 250 may generate the aforementioned ME instructions 222 that are transferred through the each local MBIST controller $202_{1-N}$ to be decoded therewithin. In one or more embodiments, once ME instructions 222 are decoded, the aforementioned ME instructions 222 may be applied to memories 220; an ME instruction 222 may be utilized to select a sequence of operations that is applied to one or more memories 220 under test. In one or more embodiments, MBIST design 200 may involve a test controller 270 (e.g., a debug interface/JTAG controller) to recognize communication protocol(s) during the simulation and to generate internal control signals. Further, test controller 270 may enable procuring data (e.g., connectivity descriptors 190 et al.) related to verification/simulation of electronic circuit 170. The aforementioned test controller 270 is shown as being coupled to central MBIST controller 250 in FIG. 2.

Figure 3:
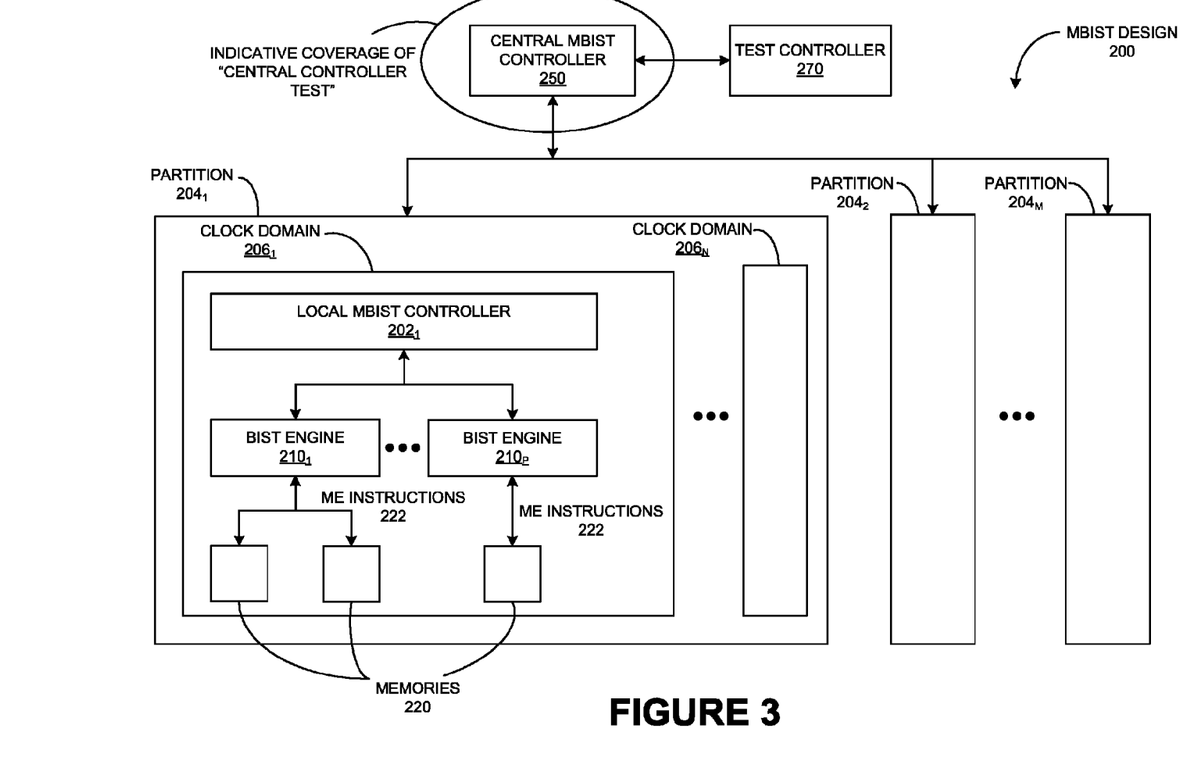
FIG. 3 is a schematic view of the MBIST design of FIG. 2 with the coverage of a "central controller test" indicated therein.

In one or more embodiments, only a selected set of ME instructions 222 may be executed so that the redundant functionality checks are removed and verification runtime is optimized. In one or more embodiments, depending on the BIST functionality, a group of ME instructions 222 may be selected such that the same type of read/write operations, data background operations, types of address increment/decrement etc. are omitted in the optimized set (e.g., during decoding of ME instructions 222 through the one or more BIST engines $210_{1-P}$); the aforementioned optimized set may be termed "reduced MBIST test." FIG. 2 shows the indicative coverage of this "reduced MBIST test." The aforementioned test may have a coverage hole at the MBIST controller logic level as all combinations of decoded ME instructions are not tested. To cover this, an additional test to verify all combinations at the level of central MBIST controller 250 may be performed; the aforementioned test may be termed "central controller test." Indicative coverage of the "central controller test" is shown in FIG. 3. In one or more embodiments, the "central controller test" may check for correct generation of all decoded ME instructions.

Figure 4:
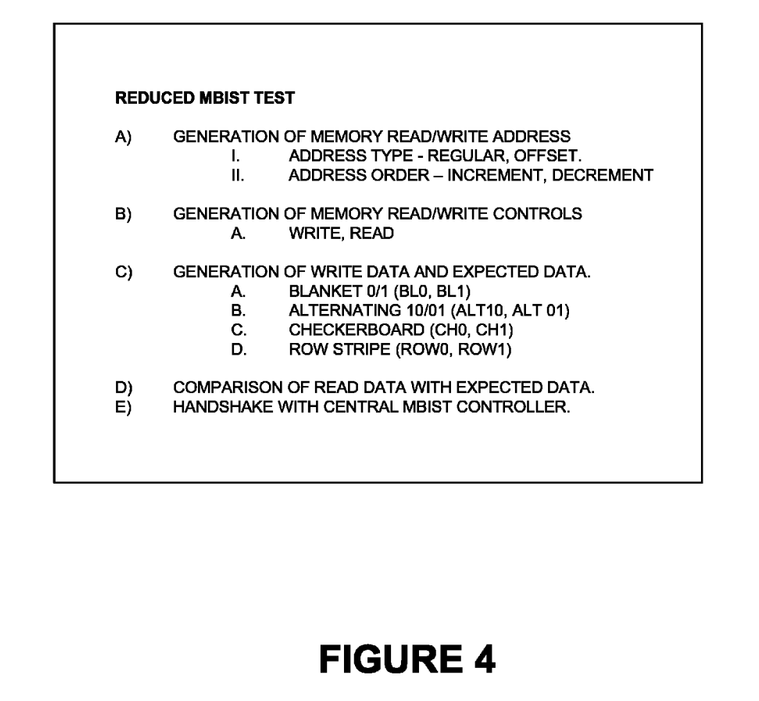
FIG. 4 is a table of operations associated with one or more BIST engines of the MBIST design of FIG. 2 as utilized during a "reduced MBIST test."

Thus, in one or more embodiments, the combination of "reduced MBIST test" and "central controller test" may provide for 100% verification coverage of the MBIST, whilst simultaneously reducing the runtime significantly. FIG. 4 shows a table of operations associated with the one or more BIST engines $210_{1-P}$ as utilized during the "reduced MBIST test." The "reduced MBIST test" may focus on checking functionalities associated with the one or more BIST engines $210_{1-P}$ and the one or more local MBIST controllers $202_{1-N}$. The "blanket," "alternating," "checkboard" and "row stripe" patterns are known to one skilled in the art and are provided merely for example purposes.

Figure 5:
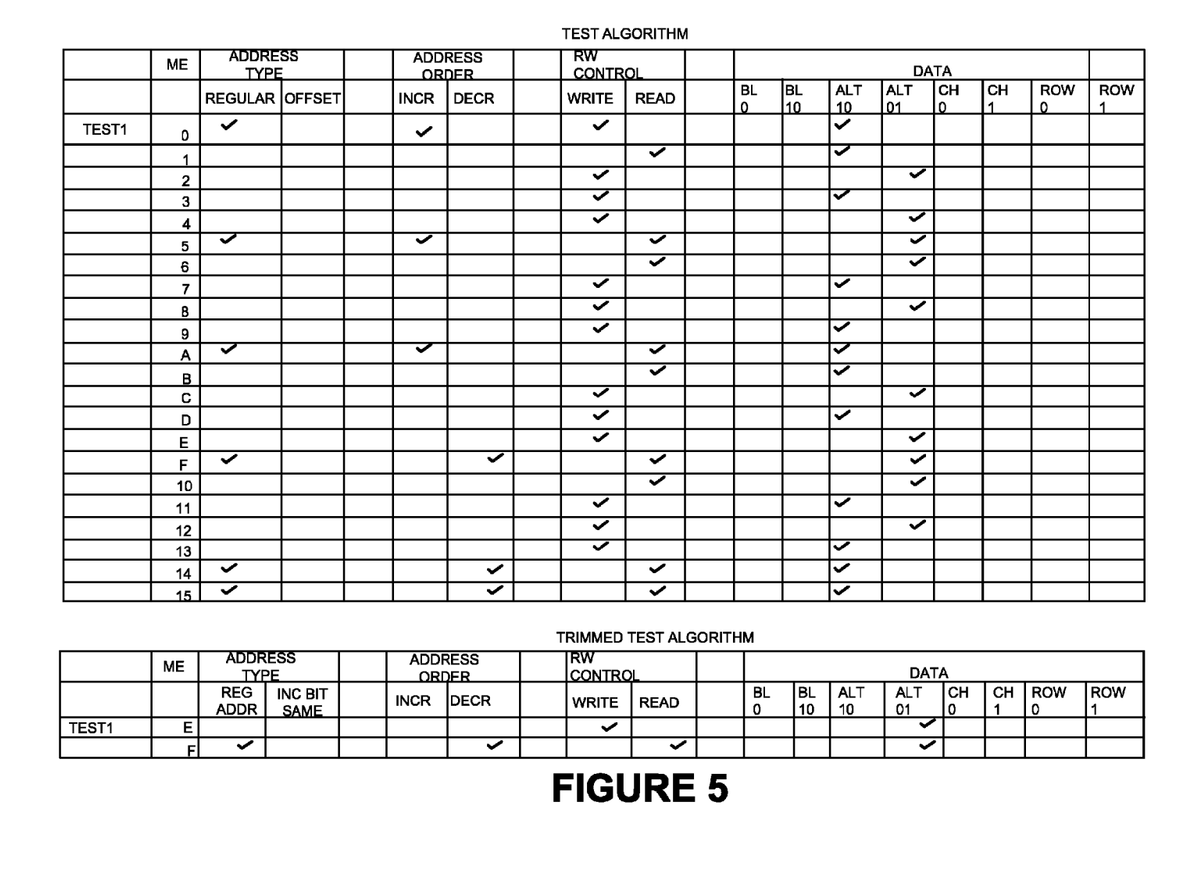
FIG. 5 is a table detailing coverage of a test algorithm of the MBIST logic in accordance with the implementation shown in FIGS. 2-3.

In one or more embodiments, each march algorithm involving ME instructions 222 may perform the operations shown in FIG. 4 in a specific order to test a memory for specific silicon (or, other material) faults. In one or more embodiments, out of all the ME instructions 222 of the algorithm, a few unique ME instructions 222 may be selected to cover a maximum portion of the functionalities with minimal overlap. In one or more embodiments, such ME instructions 222 may be selected from each march algorithm to cover every combination of operations of the one or more BIST engines $210_{1-P}$ once. FIG. 5 shows a table detailing coverage of a test algorithm 180 of the MBIST logic in accordance with the implementation shown in FIGS. 2-3. Each row of the table shows one such ME instruction 222 and the corresponding columns show the related MBIST operation (marked with "✓"). Rows corresponding to ME instructions 222 E and F show the operations selected for the optimized MBIST verification. The selected ME instructions 222 for optimized verification are also shown in FIG. 5.

To summarize FIG. 5, the test algorithm requires 22 ME instructions to cover the following operations, viz. a) regular address type, b) increment and decrement addressing and c) ALT 01 & ALT 10 data patterns (alternating). However, the trimmed test algorithm requires only 2 ME instructions to cover the following operations, viz. a) regular address type, b) decrement addressing and c) ALT 01 data patterns (alternating). The operations not covered by the algorithm discussed with regard to FIG. 5 may be covered by other trimmed test algorithms (not shown due to obviousness thereof in view of the discussion herein). In this way, trimmed test patterns/algorithms may provide for 100% verification coverage of the MBIST engines whilst maintaining a significantly low runtime.

The tests discussed above with regard to the "reduced MBIST test" may cover the one or more BIST engines $210_{1-P}$ and the one or more local MBIST controllers $202_{1-N}$ discussed above. However, the aforementioned tests may not cover decoding of all the ME instructions 222. This may be covered by the "central controller test" discussed above. Here, the local MBIST controllers $202_{1-N}$ may be programmed to execute all the march algorithms. However, features of electronic design simulation tool 106 may be exploited to mimic the behavior of the one or more BIST engines $210_{1-P}$ in a virtual environment thereof. This may enable the local MBIST controllers $202_{1-N}$ to walk through test algorithms 180 without actual execution thereof on the memories (e.g., memories 174, memories 220). Electronic design simulation tool 106 may compare values of the decoded ME instruction 222 with expected values (e.g., through the one or more BIST engines $210_{1-P}$) and report mismatches if any.

In the example discussed herein, the "reduced MBIST test" and the "central controller test" together may verify all logic of the MBIST without redundancy therein. Generalizing, in one or more embodiments, a substantial improvement in runtime of the verification algorithms may be achieved.

It is to be noted that the intent of the optimized MBIST verification discussed above is to check electronic circuit 170 for connectivity issues instead of hardware issues at, say, the RTL and the connectivity descriptor level. The targeted testing of connectivity descriptors 190 may identify an optimum set of vectors in the test scheme to test all the logic involved in the design of electronic circuit 170 (and not the memory faults). Thus, the optimization occurs through identifying the minimum set of vectors/tests to cover the entire logic involved in the design of electronic circuit 170, in contrast to a full simulation involving a full set of vectors. Also, the aforementioned optimization occurs without any coverage faults discussed above.

Further, it is obvious that central MBIST controller 250 may directly transmit instructions to the one or more BIST engines $210_{1-P}$ for execution instead of employing local MBIST controllers $202_{1-N}$. All variations in implementation of MBIST design 200 are within the scope of the exemplary embodiments discussed herein. In the case of integrated circuits with low-gate count, MBIST/test controller(s) may not be implemented at all. Test algorithms may be executed from the top-level to perform the requisite verification. Such fundamental variations are also within the scope of the exemplary embodiments. Last but not the least, the concepts discussed herein may be extended to any type of logic employed in navigating silicon (or, other material) faults of electronic circuit 170. The concepts are not restricted to the MBIST implementation discussed above. The aforementioned concepts may also be embedded in existing verification tools.

Instructions associated with the optimization discussed above may also be made available on a non-transitory medium (e.g., a Compact Disc (CD), a Digital Video Disc (DVD), a Blu-ray Disc®, a hard drive capable of storing the instructions as files) readable through computing device 100. In one or more embodiments, the aforementioned instructions may be part of an existing verification tool, part of a newly developed verification tool or part of a standalone set executable through processor 102. It should be noted that even when the verification tool is loaded, processor 102 may be configured to execute all instructions associated with the optimization.

Figure 6:
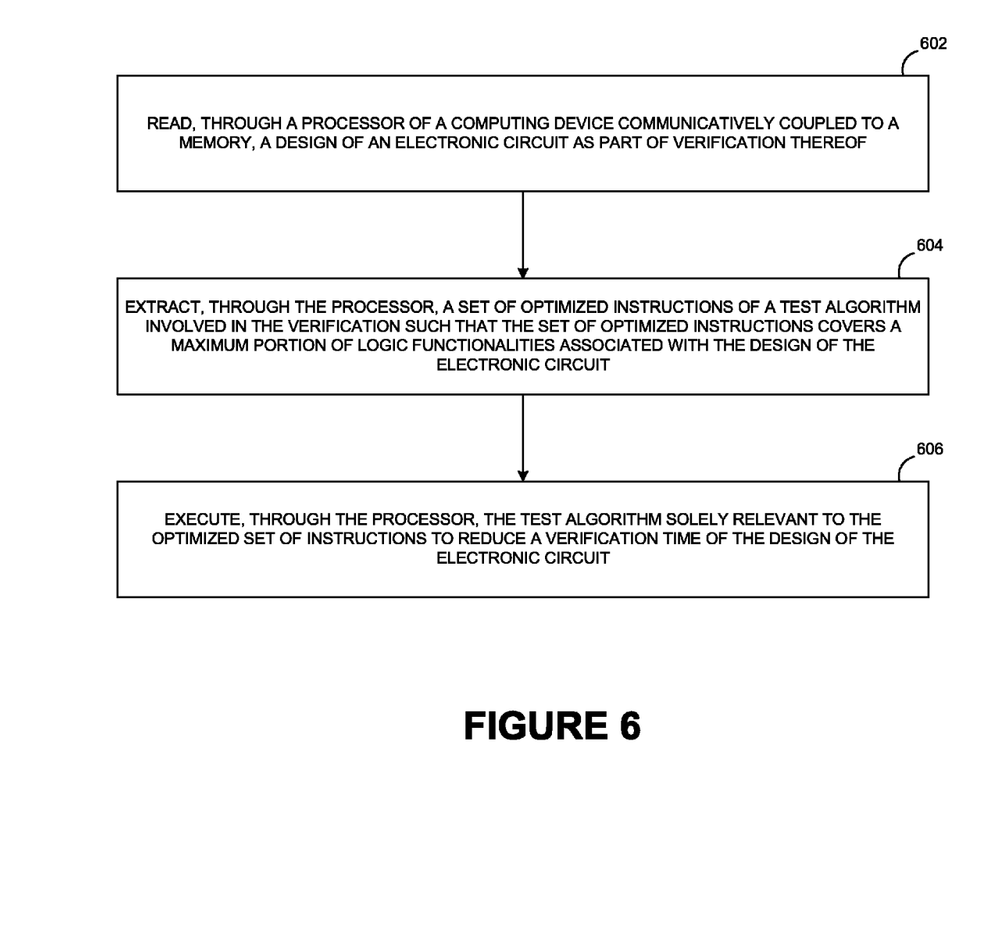
FIG. 6 is a process flow diagram detailing the operations involved in an optimized design verification of an electronic circuit through the computing device of FIG. 1, according to one or more embodiments.

FIG. 6 shows a process flow diagram detailing the operations involved in an optimized design verification of electronic circuit 170, according to one or more embodiments. In one or more embodiments, operation 602 may involve reading, through processor 102 of computing device 100 communicatively coupled to memory 104, a design of electronic circuit 170 as part of verification thereof. In one or more embodiments, operation 604 may involve extracting, through processor 102, a set of optimized instructions of a test algorithm 180 involved in the verification such that the set of optimized instructions covers a maximum portion of logic functionalities associated with the design of electronic circuit 170. In one or more embodiments, operation 606 may then involve executing, through processor 102, test algorithm 180 solely relevant to the optimized set of instructions to reduce a verification time of the design of electronic circuit 170.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry (e.g., CMOS based logic circuitry), firmware, software or any combination of hardware, firmware, and software (e.g., embodied in a machine-readable medium). For example, the various electrical structure and methods may be embodied using transistors, logic gates, and electrical circuits (e.g., application specific integrated (ASIC) circuitry and/or Digital Signal Processor (DSP) circuitry).

In addition, it will be appreciated that the various operations, processes, and methods disclosed herein may be embodied in a machine-readable medium and/or a machine accessible medium compatible with a data processing system (e.g., computing device 100). Accordingly, the specification and drawings are to be regarded in an illustrative rather than a restrictive sense.

What is claimed is:

1. A method comprising:
    reading, through a processor of a computing device communicatively coupled to a memory, a design of an electronic circuit as part of verification thereof;
    abstracting, through the processor, partitions of the electronic circuit based on at least one functionality thereof as part of the verification of the design;
    grouping, through the processor, circuit elements of the electronic circuit under each partition based on at least one of type and size thereof as part of the verification;
    extracting, through the processor, a set of optimized instructions of a test algorithm involved in the verification such that the set of optimized instructions covers a maximum portion of logic functionalities associated with the circuit elements of the electronic circuit in the design; and
    executing, through the processor, the test algorithm solely relevant to the optimized set of instructions to reduce a verification time of the design of the electronic circuit.

2. The method of claim 1, comprising providing the test algorithm as at least one of:
    part of an electronic design verification tool executing on the computing device; and
    part of a Built-In Self Test (BIST) of at least one circuit element of the electronic circuit.

3. The method of claim 2, further comprising, as part of the verification, at least one of:
    implementing a local BIST controller in each clock domain of the electronic circuit;
    incorporating multiple clock domains within each partition of the electronic circuit;
    grouping at least one circuit element under a single clock domain into the local BIST controller;
    implementing at least one BIST engine to be controlled by the local BIST controller based on the type of the at least one circuit element grouped thereinto;
    generating March Element (ME) instructions through the local BIST controller to be decoded by the at least one BIST engine; and
    utilizing the ME instructions to select a sequence of operations to be applied to the at least one circuit element under test.

4. The method of claim 3, further comprising trimming, through the at least one BIST engine, the ME instructions to dispense with redundant ME instructions based on checking at least one of: at least one functionality associated with the at least one BIST engine and at least one functionality associated with the local BIST controller.

5. The method of claim 3, further comprising:
    trimming, through the at least one BIST engine, the ME instructions during decoding thereof;
    mimicking a behavior of the at least one BIST engine in a virtual environment; and
    walking through the test algorithm solely relevant to the trimmed ME instructions utilizing the local BIST controller without actual execution thereof on the at least one circuit element under test.

6. The method of claim 5, further comprising comparing a value of a decoded ME instruction with an expected value thereof through the at least one BIST engine to detect a mismatch therein.

7. The method of claim 3, further comprising at least one of:
    selecting at least one memory of the electronic circuit as the at least one circuit element; and
    utilizing connectivity descriptors of the circuit elements of the electronic circuit in the test algorithm for optimization thereof.

8. A computing device comprising:
    a memory; and
    a processor communicatively coupled to the memory, the processor being configured to execute instructions to:
        read a design of an electronic circuit as part of verification thereof,
        abstract partitions of the electronic circuit based on at least one functionality thereof as part of the verification of the design,
        group circuit elements of the electronic circuit under each partition based on at least one of type and size thereof as part of the verification,
        extract a set of optimized instructions of a test algorithm involved in the verification such that the set of optimized instructions covers a maximum portion of logic functionalities associated with the circuit elements of the electronic circuit in the design, and
        execute the test algorithm solely relevant to the optimized set of instructions to reduce a verification time of the design of the electronic circuit.

9. The computing device of claim 8, wherein the test algorithm is provided as at least one of:
    part of an electronic design verification tool executing on the computing device, and
    part of a BIST of at least one circuit element of the electronic circuit.

10. The computing device of claim 9, wherein the processor is further configured to execute instructions as part of the verification to at least one of:
    implement a local BIST controller in each clock domain of the electronic circuit,
    incorporate multiple clock domains within each partition of the electronic circuit,
    group at least one circuit element under a single clock domain into the local BIST controller,
    implement at least one BIST engine to be controlled by the local BIST controller based on the type of the at least one circuit element grouped thereinto,
    generate ME instructions through the local BIST controller to be decoded by the at least one BIST engine, and
    utilize the ME instructions to select a sequence of operations to be applied to the at least one circuit element under test.

11. The computing device of claim 10, wherein the processor is further configured to execute instructions to trim, through the at least one BIST engine, the ME instructions to dispense with redundant ME instructions based on checking at least one of: at least one functionality associated with the at least one BIST engine and at least one functionality associated with the local BIST controller.

12. The computing device of claim 10, wherein the processor is further configured to execute instructions to:
trim, through the at least one BIST engine, the ME instructions during decoding thereof,
mimic a behavior of the at least one BIST engine in a virtual environment, and
walk through the test algorithm solely relevant to the trimmed ME instructions utilizing the local BIST controller without actual execution thereof on the at least one circuit element under test.

13. The computing device of claim 12, wherein the processor is further configured to execute instructions to compare a value of a decoded ME instruction with an expected value thereof through the at least one BIST engine to detect a mismatch therein.

14. The computing device of claim 10, wherein the processor is further configured to execute instructions to:
select at least one memory of the electronic circuit as the at least one circuit element, and
utilize connectivity descriptors of the circuit elements of the electronic circuit in the test algorithm for optimization thereof.

15. A non-transitory medium, readable through a computing device and including instructions embodied therein that are executable through the computing device, comprising:
instructions to read, through a processor of the computing device communicatively coupled to a memory, a design of an electronic circuit as part of verification thereof;
instructions to abstract, through the processor, partitions of the electronic circuit based on at least one functionality thereof as part of the verification of the design;
instructions to group, through the processor, circuit elements of the electronic circuit under each partition based on at least one of type and size thereof as part of the verification;
instructions to extract, through the processor, a set of optimized instructions of a test algorithm involved in the verification such that the set of optimized instructions covers a maximum portion of logic functionalities associated with the circuit elements of the electronic circuit in the design; and
instructions to execute, through the processor, the test algorithm solely relevant to the optimized set of instructions to reduce a verification time of the design of the electronic circuit.

16. The non-transitory medium of claim 15, comprising instructions to provide the test algorithm as at least one of:
part of an electronic design verification tool executing on the computing device; and
part of a BIST of at least one circuit element of the electronic circuit.

17. The non-transitory medium of claim 16, further comprising, as part of the verification, at least one of:
instructions to implement a local BIST controller in each clock domain of the electronic circuit;
instructions to incorporate multiple clock domains within each partition of the electronic circuit;
instructions to group at least one circuit element under a single clock domain into the local BIST controller;
instructions to implement at least one BIST engine to be controlled by the local BIST controller based on the type of the at least one circuit element grouped thereinto;
instructions to generate ME instructions through the local BIST controller to be decoded by the at least one BIST engine; and
instructions to utilize the ME instructions to select a sequence of operations to be applied to the at least one circuit element under test.

18. The non-transitory medium of claim 17, further comprising instructions to trim, through the at least one BIST engine, the ME instructions to dispense with redundant ME instructions based on checking at least one of: at least one functionality associated with the at least one BIST engine and at least one functionality associated with the local BIST controller.

19. The non-transitory medium of claim 17, further comprising:
instructions to trim, through the at least one BIST engine, the ME instructions during decoding thereof;
instructions to mimic a behavior of the at least one BIST engine in a virtual environment; and
instructions to walk through the test algorithm solely relevant to the trimmed ME instructions utilizing the local BIST controller without actual execution thereof on the at least one circuit element under test.

20. The non-transitory medium of claim 19, further comprising instructions to compare a value of a decoded ME instruction with an expected value thereof through the at least one BIST engine to detect a mismatch therein.

* * * * *